US008368890B2

(12) United States Patent
Brunner et al.

(10) Patent No.: US 8,368,890 B2
(45) Date of Patent: Feb. 5, 2013

(54) POLARIZATION MONITORING RETICLE DESIGN FOR HIGH NUMERICAL APERTURE LITHOGRAPHY SYSTEMS

(75) Inventors: Timothy A. Brunner, Hopewell Junction, NY (US); Gregory R. McIntyre, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 380 days.

(21) Appl. No.: 12/707,962

(22) Filed: Feb. 18, 2010

(65) Prior Publication Data

US 2010/0208264 A1   Aug. 19, 2010

Related U.S. Application Data

(60) Provisional application No. 61/153,787, filed on Feb. 19, 2009.

(51) Int. Cl.
*G01J 4/00* (2006.01)
(52) U.S. Cl. .................. 356/367; 356/364
(58) Field of Classification Search .............. 356/367
See application file for complete search history.

(56) References Cited

U.S. PATENT DOCUMENTS

| 5,674,650 | A | 10/1997 | Dirksen et al. |
| 7,045,256 | B2 | 5/2006 | Chen et al. |
| 7,286,245 | B2 | 10/2007 | Wegmann et al. |
| 7,307,689 | B2 | 12/2007 | Du Mee et al. |
| 2003/0203292 | A1 | 10/2003 | Chen et al. |
| 2006/0187451 | A1 | 8/2006 | McIntyre et al. |
| 2007/0064572 | A1 | 3/2007 | Zachar |

OTHER PUBLICATIONS

Application No. PCT/US2010/024699—Reference FIS920070327 Applicant: International Business Machines Corporation Filing Date: Feb. 19, 2010 ISR/Writen Opinion.

*Primary Examiner* — Gregory J Toatley
*Assistant Examiner* — Hina F Ayub
(74) *Attorney, Agent, or Firm* — DeLio & Peterson, LLC; Kelly M. Nowak; Parashost T. Kalaitzis

(57) ABSTRACT

This invention relates to the manufacture of semiconductor substrates such as wafers and to a method for monitoring the state of polarization incident on a photomask in projection printing using a specially designed polarization monitoring reticle for high numerical aperture lithographic scanners. The reticle measures 25 locations across the slit and is designed for numerical apertures above 0.85. The monitors provide a large polarization dependent signal which is more sensitive to polarization. A double exposure method is also provided using two reticles where the first reticle contains the polarization monitors, clear field reference regions and low dose alignment marks. The second reticle contains the standard alignment marks and labels. For a single exposure method, a tri-PSF low dose alignment mark is used. The reticles also provide for electromagnetic bias wherein each edge is biased depending on that edge's etch depth.

33 Claims, 14 Drawing Sheets

POLARIZATION MONITORING RETICLE DESIGN FOR HIGH NUMERICAL APERTURE LITHOGRAPHY SYSTEMS

This non-provisional application claims the benefit of the provisional application filed with the United States Patent and Trademark Office as Ser. No. 61/153,787 entitled "POLARIZATION MONITORING RETICLE DESIGN FOR HIGH NUMERICAL APERTURE LITHOGRAPHY SYSTEMS", filed Feb. 19, 2009.

BACKGROUND OF THE INVENTION

1. Field of the Invention

This invention relates to the manufacture of semiconductor substrates such as wafers and, more particularly, to a method for monitoring the state of polarization incident on a photomask in projection printing using a specially designed polarization monitoring reticle for high numerical aperture lithographic scanners.

2. Description of Related Art

As is well known, in a typical photolithographic process, a thin layer of a photosensitive material or photoresist is deposited over a semiconductor layer on a wafer. Each wafer typically is used to make many chips. During the photolithography process, illumination such as ultra-violet light is illuminated through a lens system and a photolithographic mask or reticle to a chip area on the semiconductor wafer. The reticle has a particular desired device or circuit pattern and the pattern is exposed over a portion of the chip area by the illumination to create exposed and unexposed regions on the chip. These exposed or unexposed regions are then removed and the underlying layer is etched to create the desired pattern in the semiconductor layer. The etched semiconductor layer is then further processed to create the desired circuit or device portion in that layer. This photolithography process is repeated multiple times on successive layers of the wafer to define many circuit elements on the chips on the wafer. At the end of the photolithography process, the wafer is cut into the completed semiconductor chips.

Typically, a reticle is made from a transparent plate and has a device exposure region and an opaque region. The plate is often made of glass, quartz, or the like and the opaque chrome region typically includes a layer of chrome. The device exposure region generally has a square or rectangular shape and is positioned in the center of the reticle. The device exposure region includes transparent portions and opaque portions defining a device pattern. The transparent portions in the device exposure region allow illumination from a light source to travel through them and reach the wafer. On the other hand, the opaque regions of the device region block the light and the light does not reach the wafer.

Manufacturers of microelectronic circuits are continually seeking to produce features having smaller dimensions. The lithographic production of such features typically uses a step-and-scan imaging tool 120, as shown in FIG. 1, to project a pattern onto a photosensitive resist layer on a substrate or wafer. The projection optical system of the imaging tool includes a lamp, laser, or other optical source 122 that projects radiation 124 used to illuminate a photomask or reticle 128 through a condenser lens system 126. The photomask or reticle 128 contains the pattern to be projected and reproduced on the wafer substrate, and is generally oriented substantially perpendicular to an optical axis 124 of the projection optical system. Some of the light radiation 146 that passes through the photomask 128 is collected by the projection optics 134 and the aerial image 136 of the pattern produced by passage of radiation 146 through the mask is directed onto the wafer 142, so as to create the pattern or image 140 on the wafer.

In a step-and-scan system, the photomask 128 and the wafer 142 are mounted on mask stage 133 and substrate stage 138, respectively, that move relative to the fixed optical system. The optical system contains an aperture or slit 132 through which light is allowed to pass to the reticle. The entire mask pattern within the desired transfer region of a reticle is completely exposed by scanning along the one-dimensional scan direction 130 and across the complete one-dimensional width of the transfer region to produce a complete pattern 140 on the wafer resist, for example a complete chip pattern. The scanning process is subsequently repeated to produce the desired number of patterns on the wafer 142.

In order to produce features having smaller dimensions in the manufacture of microelectronic circuits, three factors, a phenomenological process resolution factor (k1), the light wavelength ($\lambda$) and the numerical aperture value (NA) are involved in the lithographic processing that may be used to create the minimum line width ($W_{min}$) according to a standard generalization of Rayleigh's equation:

$$W_{min} = k_1 \lambda / NA$$

Sometimes a slightly different value of k1 is used that relates $\lambda$ and NA to the half-pitch of a periodic system of lines and spaces.

To enable use of finer features in integrated circuits many advances have been made in lithographic technology that allow smaller values of k1. In the early days of integrated circuit manufacture only k1 values above 1 were practical, but now k1 values near 0.3 are being employed, and further reductions are sought. A difficulty here is that image contrast is degraded at such low k1 values, making it difficult to achieve size uniformity in the printed circuit features as distributed over the chip, such size uniformity usually being required for acceptable circuit performance.

Developments of new tools and methods in lithography have led to improvements in resolution of the imaged features patterned on a device such as a wafer possibly leading to a resolution of less than 50 nm. This may be accomplished using relatively high numerical aperture (NA) lenses, wave lengths down to 157 nm and a plethora of techniques such a phase shift masks, non-conventional illumination and advanced photoresist processing. Looking at the NA (numerical aperture) factor, recent advances have enabled exposure tool manufacturers to make tools with NA values in excess of 0.70, 0.75, 0.80 and higher, and tools with NA values of 0.93 are now available. NA values higher than 1.0 are also currently achieved with the use of immersion imaging, where ultra pure water is placed between the last lens element and the photoresist. Future use of liquids with a higher index of refraction may enable NA values higher than 1.35; perhaps up to around 1.8. Because modern exposure tools have such high NA values, images must be formed using waves with high angles of propagation within the resist, i.e., large propagation angles with respect to a direction normal to the surface of the resist layer.

At the high numerical apertures that produce such incidence angles, it has been observed that there is a fundamental loss of image contrast for the transverse magnetic (TM) polarization of the light waves. Even when the source radiation is engineered to be transverse electric (TE) polarized to improve contrast of a particular feature orientation, a small amount of TM light is likely to be present. Furthermore, the ratio of TE to TM light is likely to vary across the imaging field. Depending on the NA, feature type and size, illumination configuration, and other imaging characteristics, this variation may cause distortions of the desired image across the imaging field.

With high NA projection systems it is desirable to provided polarized or at least partially polarized illumination radiation. This enables image formation at a wafer level to be enhanced by using radiation with a state of polarization which is either best suited for imaging of a particular feature, or a best case compromise among various feature types and sizes. The desired polarization characteristics of the illumination system are typically expressed as a set of Stokes parameters for each illumination pupil-fill location. The Stokes parameters are a mathematical means to completely describe the time-averaged polarization characteristics of a ray of light. This desired polarization-dependent pupil-fill function describes the intended polarization characteristics of each ray within the cone of light that illuminates the mask. The pre-determined target polarization-pupil-fill can be stored as data in a memory device and compared with the actual polarization radiation existing in the scanning process.

In U.S. Pat. No. 7,224,458 one of the inventors herein developed a method to monitor the state of polarization incident on a photomask in projection printing. The method includes a series of phase-shifting mask patterns to take advantage of high NA effects to create a signal depending on only one incident polarization component. A test reticle design is shown consisting of multiple polarimeters with an array of pin holes on the back side of the photomask. This technique is able to monitor any arbitrary illumination scheme for a particular imaging tool. The reticle comprises a set of up to six calibrated PSM analyzers for each pupil-fill coordinate for each field position of interest. These analyzers, also referred to as monitors, enable the calculation of the Stokes parameters and completely characterize the state of incident polarization in the high NA projection printing systems. In polarimetry, a set of analyzers are used to each measure the flux (F), one polarization component in the incident light. To account for the fact that the analyzer does not consist of the perfect polarization elements, the analyzers are first calibrated producing a polar unit metric measurement matrix (W) for each set of up to six analyzers. This calibration data has been used to determine the measured Stokes parameters describing the polarization states from any arbitrary illumination by solving a set of linear equations.

A proposed reticle design is shown in FIG. 1 of the patent showing the front and back side of the reticle for a particular field location. Multiple sets of polarimeters are used in a cluster near each pin hole location where each polarimeter set has up to six analyzers and a unique period and orientation of the four-phase linear progression depending on its relative locations of the pin holes, or likewise, the desired σ measurement.

FIG. 2 shows a monitor similar to the prior art existing monitor as in U.S. Pat. No. 7,224,458. This monitor gives a signal for TE and TM polarization and their bisectors (45°, 135°, and uses a four phase grating 69 that is always oriented parallel to the axis at a given location within the cluster.

There still exists, however, a need to monitor polarization in high numerical aperture lithographic scanners and the subject invention is an improvement of the test reticle and technology disclosed in U.S. Pat. No. 7,224,458, the disclosure of which is hereby incorporated by reference.

SUMMARY OF THE INVENTION

Bearing in mind the problems and deficiencies of the prior art, it is therefore an object of the present invention to provide a polarization monitoring reticle for lithographic scanners.

It is a further object of the present invention to provide a stable and optimum process for making semiconductor wafers utilizing the polarization monitoring reticle of the invention.

In another object of the present invention a polarization monitoring reticle system for lithographic scanning is provided comprising two polarization monitoring reticles which are used sequentially for lithographic scanners.

In still another object of the present invention to provide a stable and optimum process for making semiconductor wafers using the polarization monitoring reticle system of the invention.

Still other objects and advantages of the invention will in part be obvious and will in part be apparent from the specification.

The above and other objects, which would be apparent to those skilled in the art, are achieved in the present invention which is directed to, in a first aspect, a polarization monitoring reticle for lithographic scanners comprising:

a transparent planar substrate having a front side and a back side, both the back side and front side having an opaque layer thereon;

an X-Y row and column array of pin hole-cluster combinations on the substrate;

each cluster comprising an X-Y array of a plurality of polarimeter sets in the opaque layer on the front side of the substrate, with each cluster located adjacent a corresponding pin hole in the opaque layer on the back side of the substrate;

each set of polarimeters comprising an X-Y array of a plurality of polargraphic monitors within each set, each monitor within each polarimeter set being a defined distance from the center of the polarimeter set and each set of polarimeters having indicia identifying the cluster row, cluster column, X position of the center of the polarimeter set relative to the cluster center and Y position of the center of the polarimeter set relative to the cluster center, the monitors creating at an image plane a measurable output signal dependent on polarization of illumination when illumination from a light source is passed through the reticle.

In another aspect of the invention the above referenced polarization monitoring reticle is used in a method for imaging a wafer with a lithographic scanner. The method comprises:

providing a lithographic scanning system having a light source and a numerical aperture of at least 0.85;

providing a reticle comprising a transparent planar substrate having a front side and a back side, both the front side and the back side having an opaque layer thereon and an X-Y row and column array of pin hole-cluster combinations on the substrate, each cluster comprising an X-Y array of a plurality of polarimeter sets in the opaque layer on the front side of the substrate, with each cluster located adjacent a corresponding pin hole in the opaque layer on the back side of the substrate, each set of polarimeters comprising an X-Y array of a plurality of polargraphic monitors within each set, each monitor within each polarimeter set being a defined distance from the center of the polarimeter set and each set of polarimeters having indicia identifying the cluster row, cluster column, X position of the center of the polarimeter set relative to the cluster center and Y position of the center of the polarimeter set relative to the cluster center;

passing illumination from the light source through the reticle and exposing a photoresist layer, whereby the monitors creating a measurable output signal dependent on polarization of illumination; and measuring the resulting images in the photoresist layer to determine the degree of polarization of the illumination passed through the reticle.

In another aspect of the invention, a polarization monitoring reticle system for lithographic scanners comprises:

a first reticle comprising:
   a first transparent planar substrate having a front side and a back side, both the back side and front side having an opaque layer thereon;
   an X-Y row and column array of pin hole-cluster combinations on the first substrate;
   each cluster on the first substrate comprising an X-Y array of a plurality of polarimeter sets in the opaque layer on the front side of the first substrate, with each cluster located adjacent a corresponding pin hole in the opaque layer on the back side of the first substrate;
   each set of polarimeters on the first substrate comprising an X-Y array of a plurality of polargraphic monitors within each set, each monitor within each polarimeter set being a defined distance from the center of the polarimeter set,
   the monitors on the first substrate creating at an image plane a measurable output signal dependent on polarization of illumination when illumination from a light source is passed through the reticle; and a second reticle comprising:
   a second transparent planar substrate having a front side and a back side, the front side having an opaque layer thereon;
   an X-Y row and column array of clusters on the second substrate corresponding to the pin hole-cluster combinations on the first substrate;
   each cluster on the second substrate comprising an X-Y array of location indicia on the front side of the second substrate, with each cluster located adjacent a corresponding set of polarimeters on the first substrate and comprising indicia identifying the cluster row, cluster column, X position of the center of the polarimeter set relative to the cluster center and Y position of the center of the polarimeter set relative to the cluster center.

In still another aspect of the invention a method is provided for imaging a wafer with a lithographic scanner using the two-reticle system described above wherein the two reticles are scanned sequentially to monitor the polarization of the light used in the scanning imaging process. The method comprises:

providing a lithographic scanning system having a light source and a numerical aperture of at least 0.85;

providing a first reticle comprising a first transparent planar substrate having a front side and a back side, both sides having an opaque layer thereon and an X-Y row and column array of pin hole-cluster combinations on the first substrate, each cluster on the first substrate comprising an X-Y array of a plurality of polarimeter sets on the front side of the first substrate, with each cluster located adjacent a corresponding pin hole in the opaque layer on the back side of the first substrate, each set of polarimeters on the first substrate comprising an X-Y array of a plurality of polargraphic monitors within each set, each monitor within each polarimeter set being a defined distance from the center of the polarimeter set, passing illumination from the light source through the first reticle and exposing a photoresist layer, whereby the monitors creating a measurable output signal dependent on polarization of illumination;

repeating the exposure of the photoresist layer at different locations with a different dose of the illumination at each location;

providing a second reticle comprising a second transparent planar substrate having a front side and a back side, the front side having an opaque layer thereon and an X-Y row and column array of clusters on the second substrate corresponding to the pin hole-cluster combinations on the first substrate, each cluster on the second substrate comprising an X-Y array of location indicia on the front side of the second substrate, with each cluster located adjacent a corresponding set of polarimeters on the first substrate and comprising indicia identifying the cluster row, cluster column, X position of the center of the polarimeter set relative to the cluster center and Y position of the center of the polarimeter set relative to the cluster center;

passing illumination from the light source through the second reticle and exposing the photoresist layer at the same locations as with the first reticle and with the same dose of the illumination at each location;

measuring on the photoresist degree of polarization of the illumination passed through the reticle.

In another aspect of the invention a method is provided for designing a phase-shifting region in a mask for lithographic scanners comprising:

providing a design of a phase shifting region of a mask, the mask having adjacent 0°, 90°, 180° or 270° phase shifting regions of relative widths corresponding to the relative widths of phase shifted regions of light to be projected through the reticle onto a photoresist layer, the phase shifting regions being separated by vertical boundaries in the mask;

determining an average bias distance X needed to move the vertical boundaries in the mask between regions of 90° phase difference to create a desired width of phase shifted light on the photoresist layer;

biasing the design by moving each boundary between phase shifted regions toward the lower phase region by a distance D:

$$D = X \cdot (PD/90)$$

wherein PD is the difference in phase between phase shifting regions on either side of the boundary; and creating a mask having the biased design of the phase shifting regions.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 10B shows the corresponding second reticle containing other indicia identifying the position of the polarimeter set in the reticle.

DESCRIPTION OF THE PREFERRED EMBODIMENT(S)

In describing the preferred embodiment of the present invention, reference will be made herein to FIGS. 3-13B of the drawings in which like numerals refer to like features of the invention.

Polarimetry, the measurement of the polarization characteristics of light, exists in various forms in many fields of optics. A typical polarimeter consists of an intensity detector and an analyzer, which is often the combination of a waveplate rotator and a polarizer, shown in FIG. 3. By positioning the rotator and polarizer in a series of different orientations and recording the intensities allowed to pass to the detector, the polarization characteristics of the incident light beam may be inferred. To account for imperfections in the optical elements, calibration of the system is typically required by illuminating it with a set of known polarization states. The measured Stokes vector ($S_m$) describes polarization and can be determined from the series of intensity measurements at each analyzer configuration (described in the vector F) and a calibration matrix (W) as $$S_m = W^{-1} F \qquad \text{Eq. 1}$$

Figure 3:
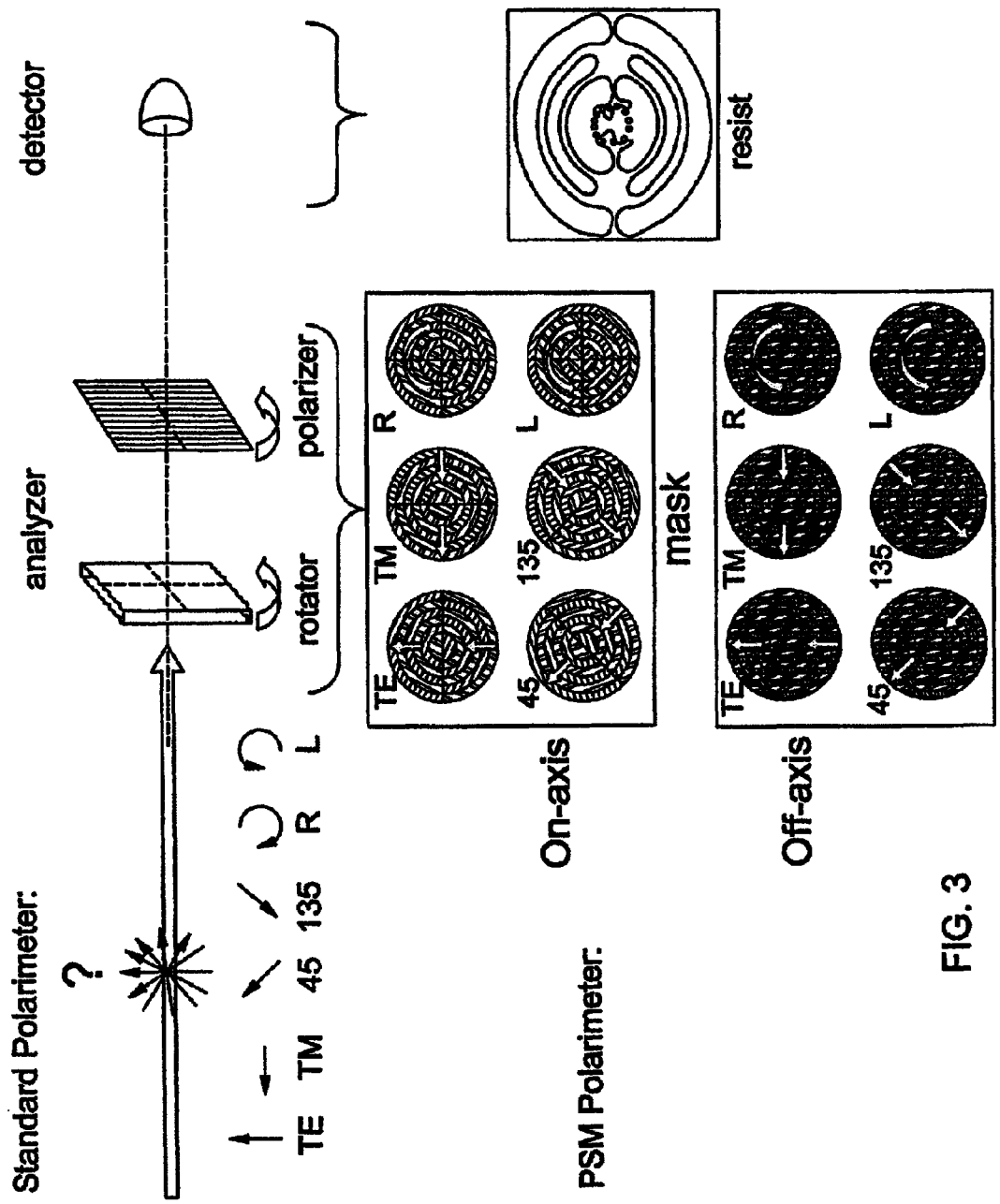
FIG. 3 shows a polarimeter including an analyzer and detector.

As indicated in FIG. 3, this invention adapts to this procedure by using a set of chromeless phase shifting mask patterns as the analyzer and photoresist as the intensity detector. The colors within the mask layout represent differing depths of etch into the quartz substrate to achieve a particular phase shift.

Figure 4:
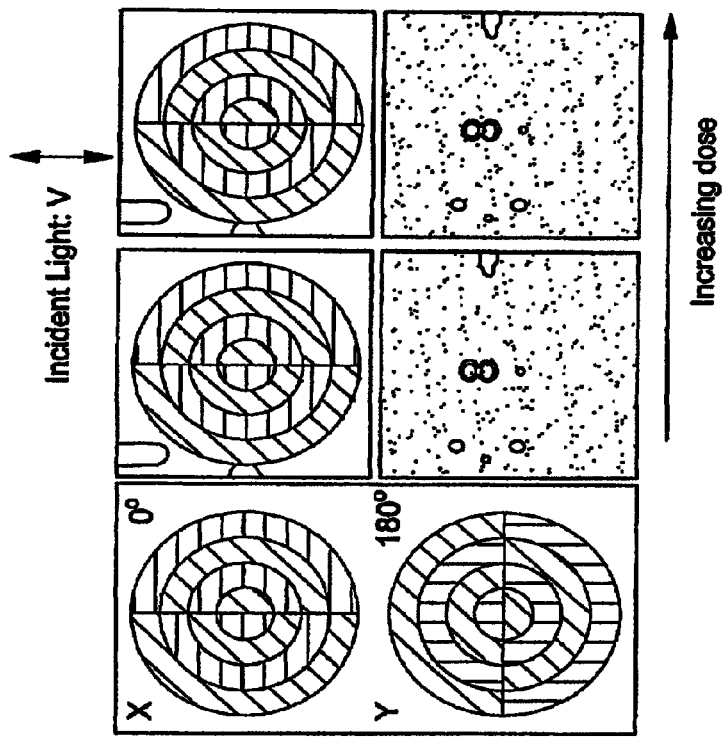
FIG. 4 shows sample resist measurements for on-axis monitors.
Figure 4:
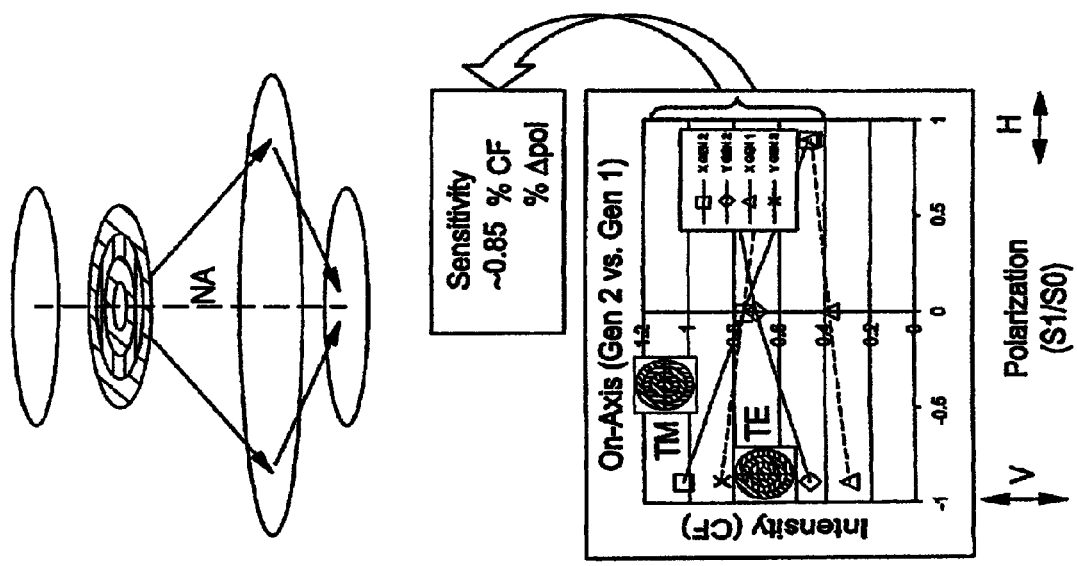
Figure 5:
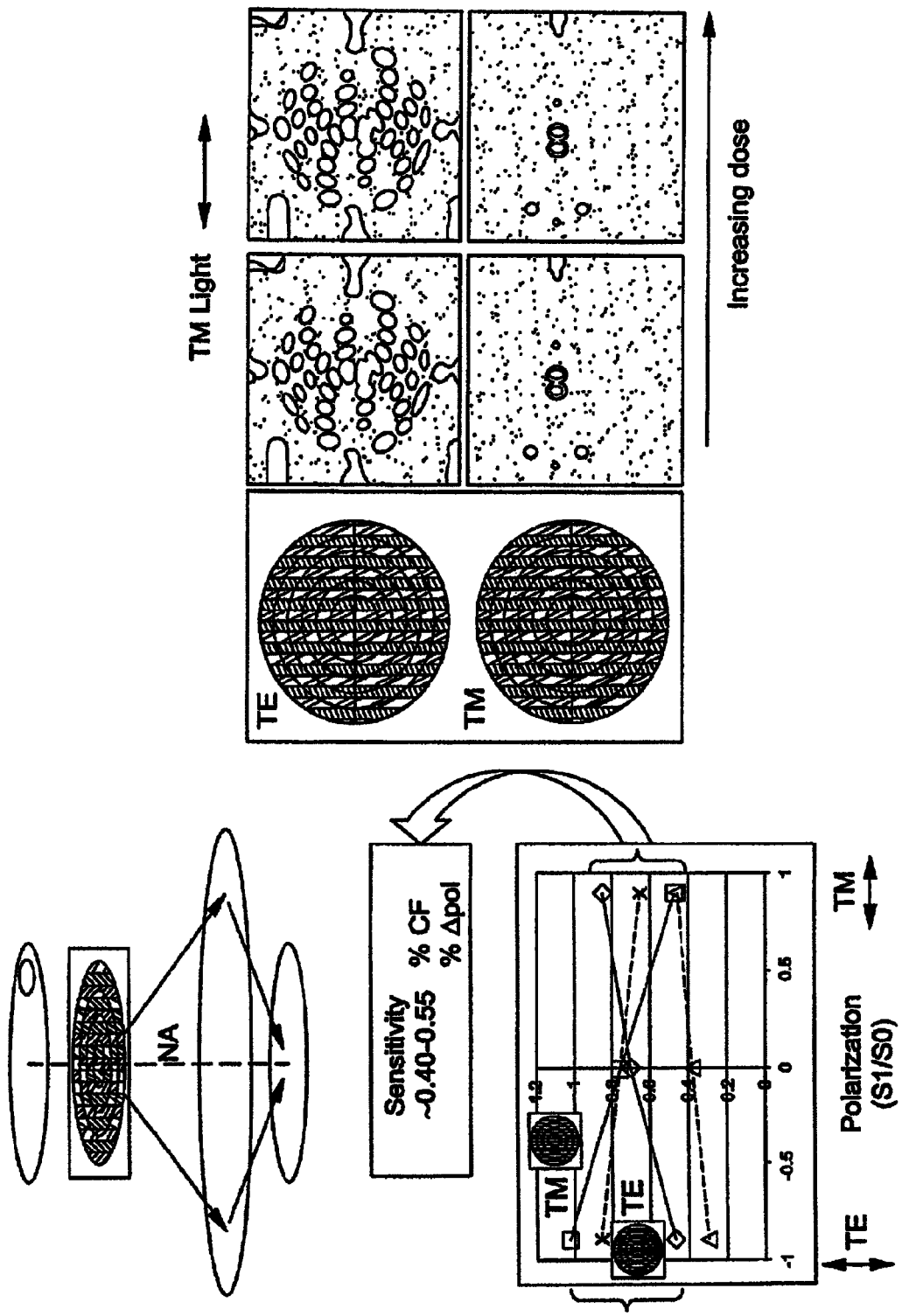
FIG. 5 shows sample resist measurements for off-axis monitors.

FIG. 4 illustrates how one of these patterns creates a polarization-dependent signal in resist for on-axis illumination. The pattern scatters light to high-angle spatial frequencies, creating a central image intensity dependent only on the local state of polarization. For vertically polarized light, the two orthogonal patterns of FIG. 4 require different dose values for the resist to clear at the center of the images. This clearing dose, when converted to a percent of the clear field intensity, is considered the measurement signal. As in the plot within FIG. 4, the on-axis measurement sensitivity is roughly 0.85 percent of the clear field per percent polarization change. To monitor polarization of oblique imaging rays, a four-phase linear grating is incorporated within the rings. Resulting resist images and measurement sensitivities for a typical off-axis ray of interest (σ=0.8) are shown in FIG. 5. Although these patterns are more difficult to manufacture and suffer from stronger electromagnetic effects, the signal is deteriorated by only about 35 to 50% when compared with the on-axis monitors.

These results are with patterns designed for and exposed with a numerical aperture of 0.93. The larger angle spatial frequencies afforded by higher numerical aperture tools will result in a stronger measurement signal, although mask manufacturing becomes more difficult. It is expected that patterns on the next generation reticle, of which data is not yet available, will yield about 1.5 times this sensitivity.

Figure 6:
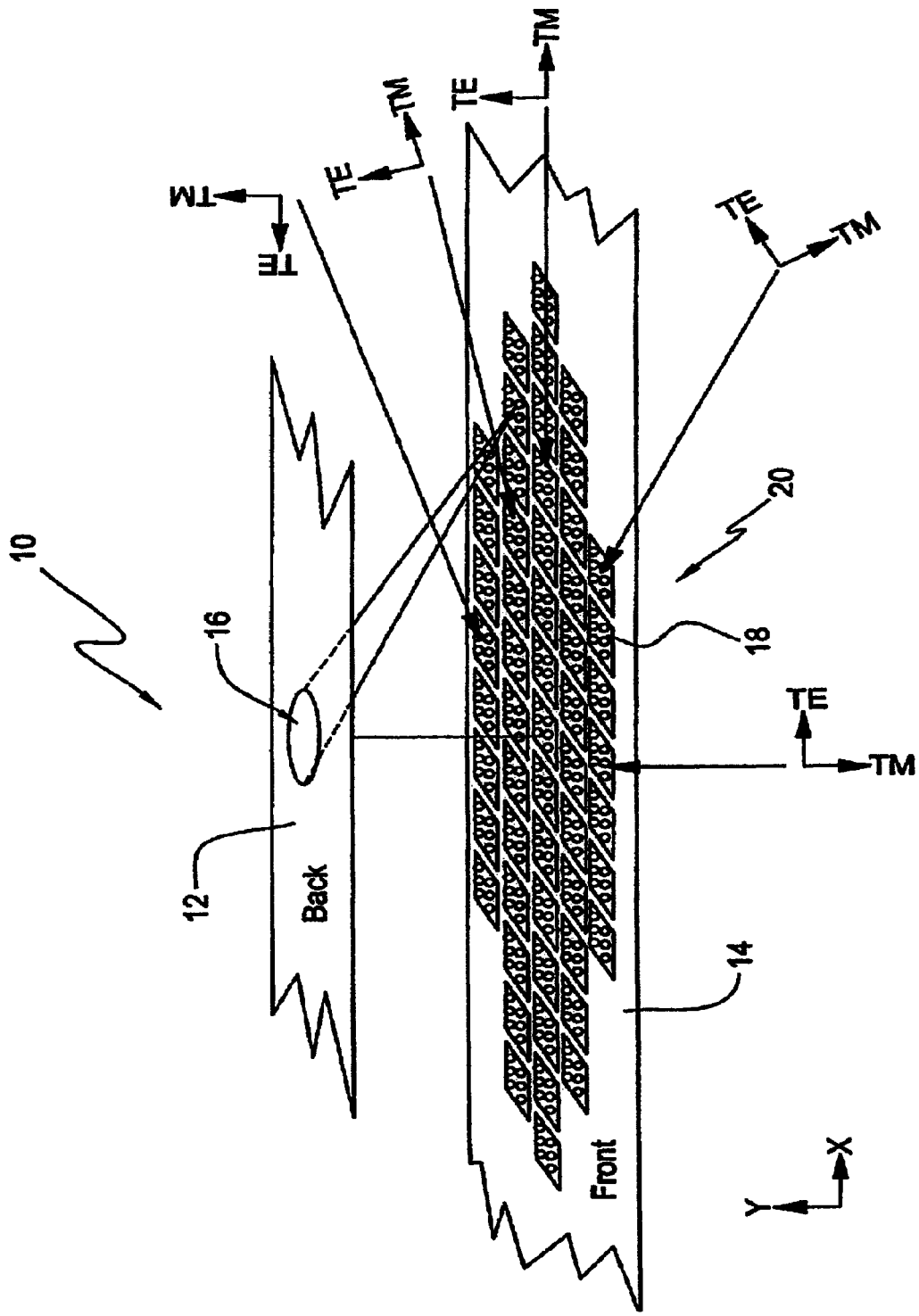
FIG. 6 shows a portion of a test reticle showing a cross-section view of one pin hole-cluster combination with the pin hole on the back side of the reticle and a cluster comprising an X-Y array of a plurality of polarimeter sets with each set comprising an X-Y array of a plurality of polargraphic analyzers.

Referring first to FIG. 6 a portion of a monitoring reticle 10 is shown having a backside 12 and a front side 14. The portion shown has one pin hole 16 and a corresponding cluster 20, with the cluster having a plurality of polarimeter sets 18. The polarimeter sets include monitors that are designed to directly measure the X and Y components and the X-Y alignments are referenced to the mask. The size of the pinholes vary depending on the numerical aperture that the corresponding cluster is designed to monitor.

Figure 7:
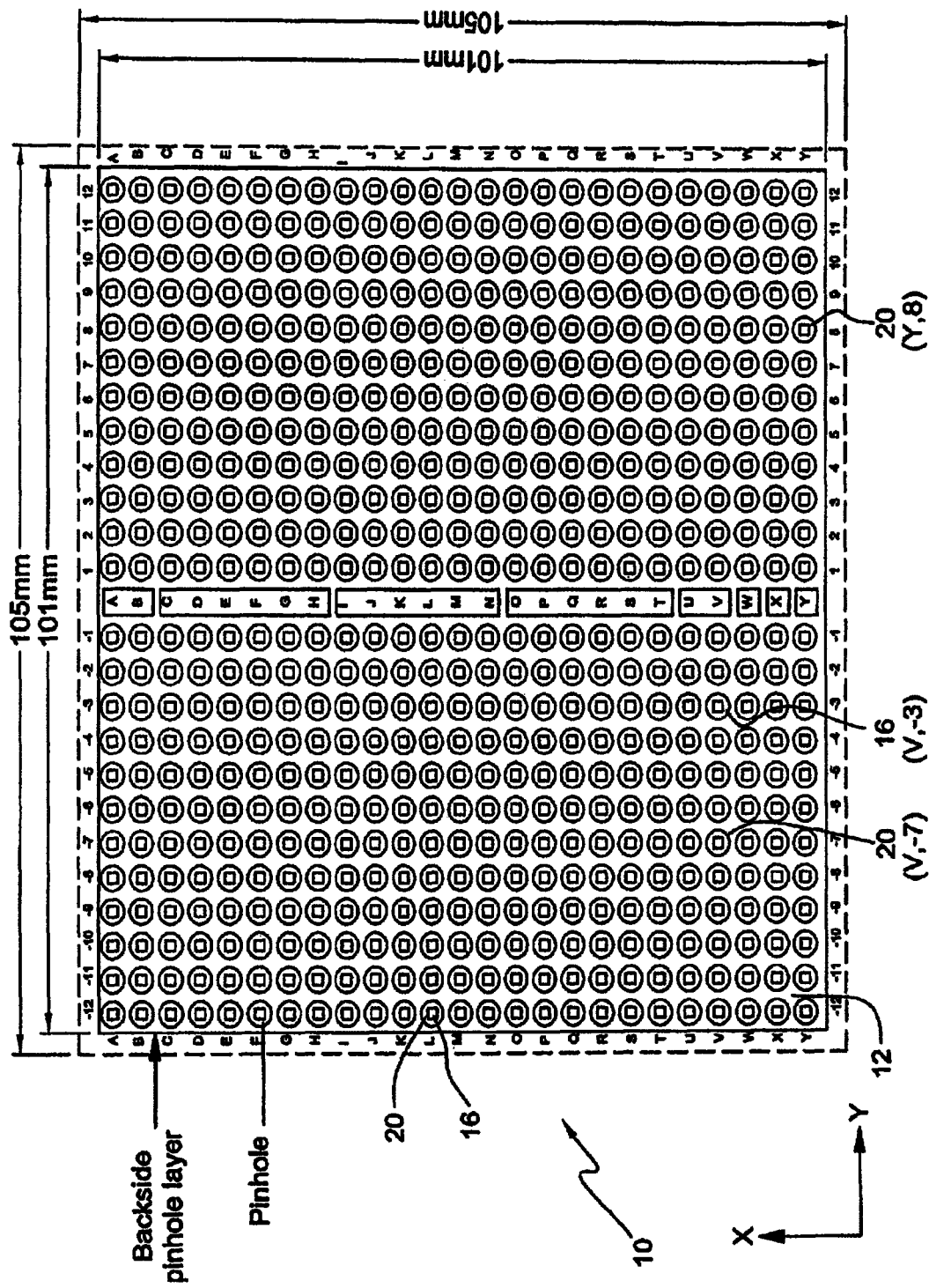
FIG. 7 shows a top-down view of a polarization monitoring reticle having a plurality of pin hole-cluster combinations in an X-Y row and column array.

In FIG. 7 a reticle is shown having rows A-Y and columns −1 to −12 and 1 to 12 in an X-Y array. The reticle 10 contains a plurality of pin holes 16 and corresponding clusters 20 in the X-Y array. Exemplary clusters 20 are shown at coordinates (V, −7) and (Y, 8) and a pin hole 16 is shown at coordinates (V, −3), which would also be the location of the corresponding cluster. Identification of these particular clusters and pin holes will be described further below with regard to the polarimeter set.

As discussed above, each cluster in the array is specified by column −12 to −1 and +1 to +12 and row A-Y. Further, each cluster in the array is specified by its NA, number of rings in each monitor ($N_r$), electromagnetic bias (EMFB), F value, pin hole radius (in μm), cluster radius (in μm) and polarimeter type (either TE/TM or X/Y).

Figure 8:
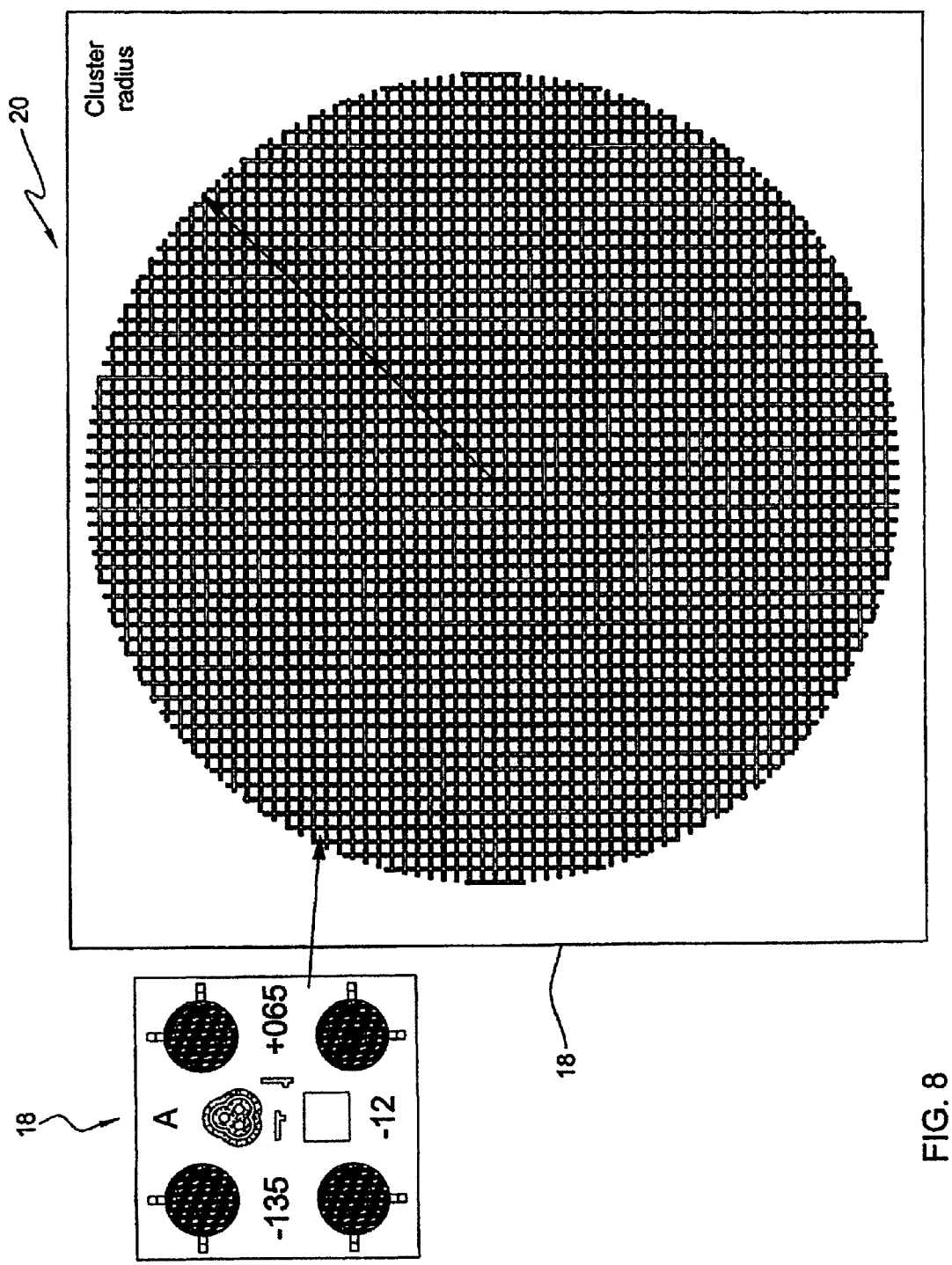
FIG. 8 shows a single cluster comprising an array of a plurality of polarimeter sets.

Referring now to FIG. 8, a cluster 20 is shown as containing a number of polarimeter sets 18. The polarimeter sets will be further described below.

Figure 9A:
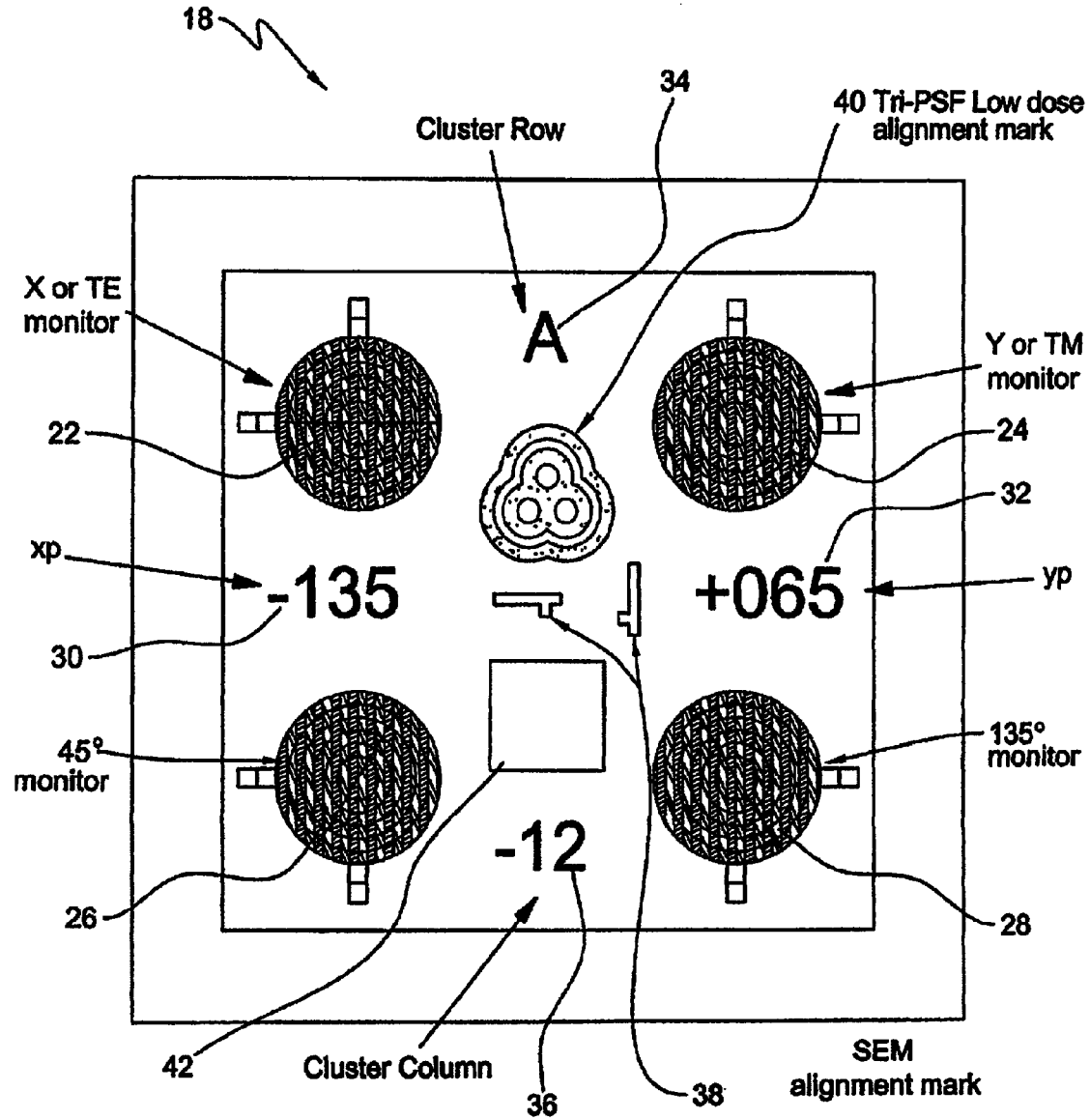
FIG. 9A shows one polarimeter set comprising an X-Y array of a plurality of polargraphic analyzers including indicia identifying the position of the polarimeter set in the reticle.
Figure 9B:
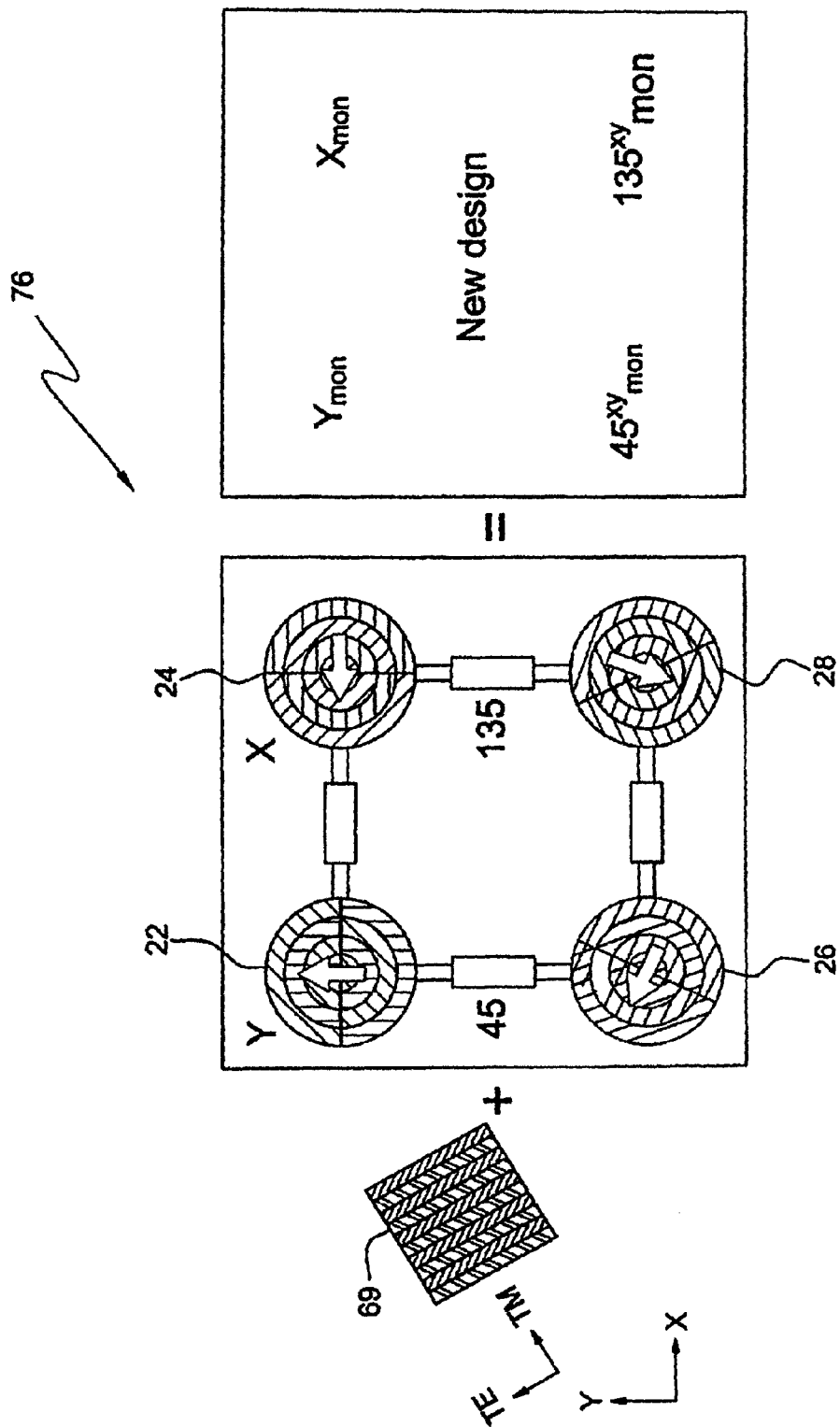
FIG. 9B shows a polarimeter set of the invention and is to be compared with the polarimeter set of the prior art as shown in FIG. 2.

FIGS. 9A and 9B show a polarimeter set for the single reticle embodiment of the invention. The polarimeter set 18 comprises Y monitor 22, X monitor 24, 45° monitor 26 and 135° monitor 28. Alternately, the polarimeter may consist of a TE monitor, TM monitor, 45° monitor and 135° monitor, respectively, as described above. The monitors are arranged in an X-Y array within each polarimeter set. The X position in the cluster for each polarimeter set array is shown by numeral 30 and the Y position in the array cluster for each polarimeter set is shown by numeral 32. The cluster row A is shown as numeral 34 and the cluster column as numeral 36. To aid in aligning the printed wafer in the metrology tool, which is typically a scanning electron microscope (SEM), there are provided SEM alignment marks 38 and a tri-PSF low-dose alignment mark 40. A clear field reference 42 is used to measure the total intensity provided to that particular polarimeter by the illuminator. This clear field measurement is used to normalize the polarization measurement and to calculate the Stokes parameters.

Figure 10A:
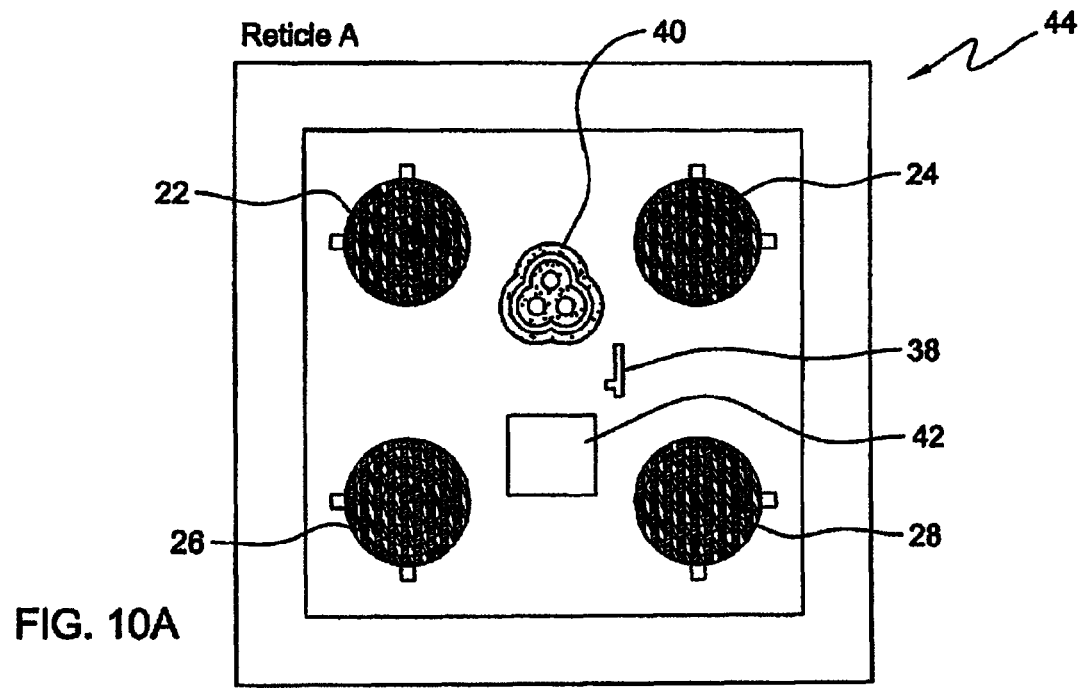
FIGS. 10A and 10B show a polarimeter set for the two-reticle polarization monitoring reticle system in which the polarimeter set in FIG. 10A shows an X-Y array of a plurality of photographic analyzers with a plurality of SEM alignment marks and an optional low-dose alignment mark.
Figure 10B:
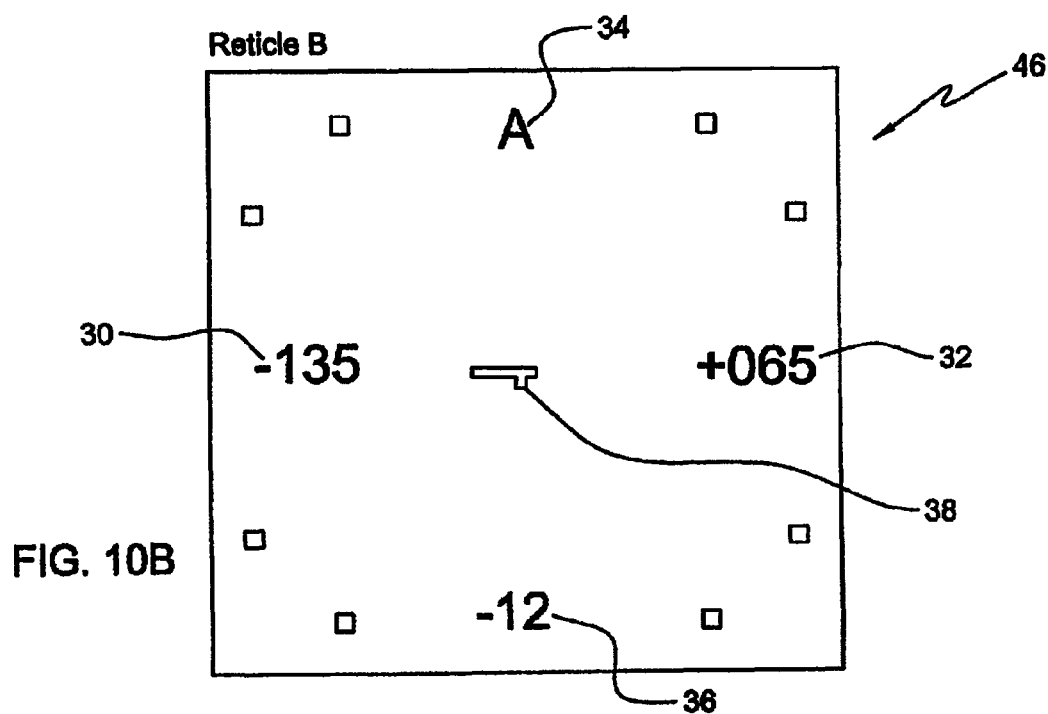

FIGS. 10A and 10B show the two-reticle system embodiment of the present invention with the first reticle being identified as numeral 44 and the second reticle being identified as numeral 46. In the first reticle 44 (FIG. 10A) the polarimeter set has the Y monitor 22, X monitor 24, 45° monitor 26, and 135° monitor 28 in an X-Y array. Alternately, the polarimeter set may consist of an X-Y array of a TE monitor, TM monitor, 45° monitor and 135° monitor, respectively, as described above. SEM alignment mark 38, a tri-PSF low-dose alignment mark 40 and a clear field reference 42 are also on first reticle 44.

The second reticle 46 (FIG. 10B) contains the location indicia for the polarimeter set: cluster row indicator 34, cluster column indicator 36, X position indicator 30 in the cluster for each parameter set array and Y position indicator 32 in the cluster for each parameter set array. Other SEM alignment marks 38 are also shown on the reticle.

A measurement with the two reticle systems of the invention consists of exposing the first reticle shown in FIG. 10A in a large dose matrix on the wafer, and exposing the second reticle shown in FIG. 10B in the same locations, but with a single optimum dose to print the alignment marks. An SEM is used to determine for each polarimeter monitor of interest the dose that causes the center of the image to clear the photoresist. This is converted to a percent of the local clear field intensity as measured in the clear field reference within the polarimeter. This intensity value is considered the measurement signal, which can then be converted into a Stokes parameter. A mathematical method for converting this measurement signal into a Stokes parameter measurement is described in U.S. Pat. No. 7,224,458. Calibration of the test reticle is important and can be done in a variety of ways. Once calibrated, a polarimetric measurement matrix (W) is defined for each polarimeter. Future measurements, when combined with this calibration matrix yield the actual measured Stokes parameters. The double reticle system is particularly useful because, in a single reticle system, there is often not enough dose to print the labels and SEM alignment marks due to the large range in dose values required to detect a signal for all polarization types.

Each polarimeter set in the cluster is specified by a number of indicators. The X position indicator xp 30 shows the position of the center of the polarimeter set relative to the cluster center in μm. The Y position indicator yp 32 shows the Y position of the center of the polarimeter set relative to the cluster center likewise in μm. The radius of the polarimeter set within the cluster, rp, is also in μm.

Figure 11A:
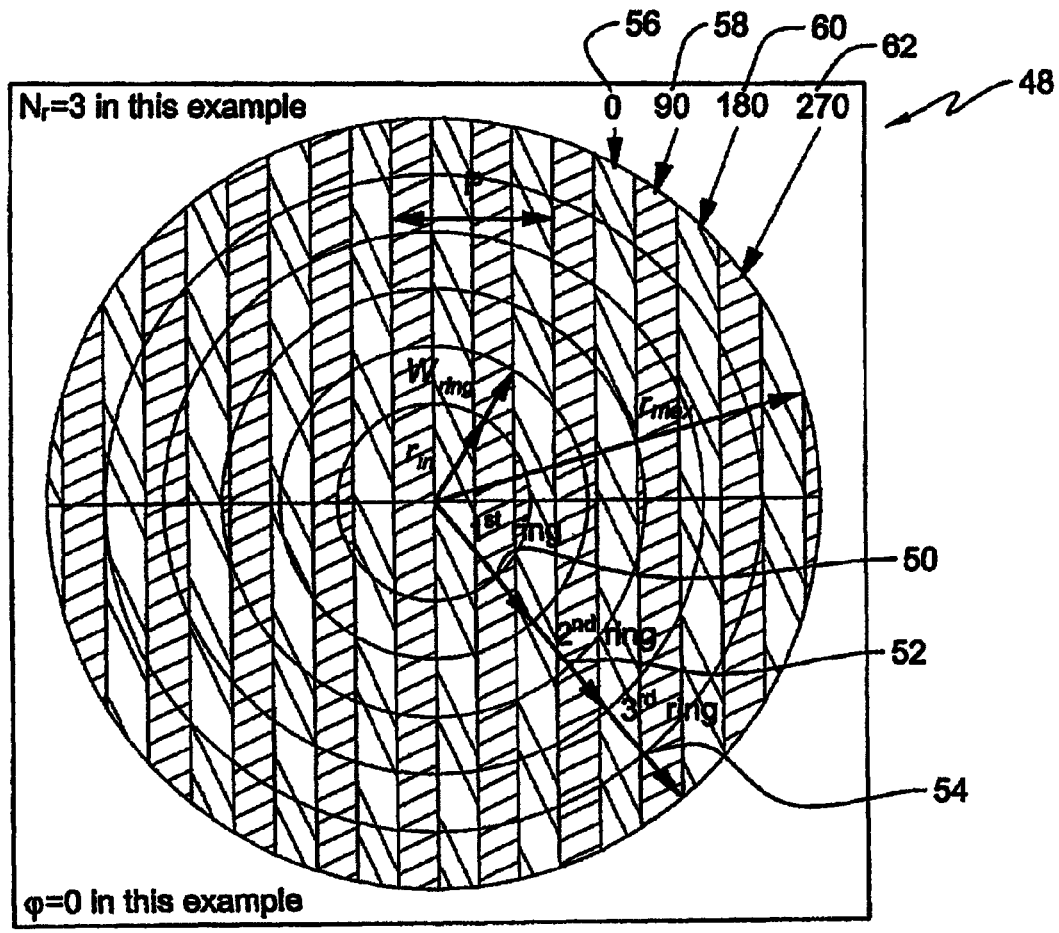
FIG. 11A shows a polarimeter set designed for off-axis illumination with a 4-phase linear phase progression incorporated into the pattern to redirect the diffraction pattern into the pupil.
Figure 11B:
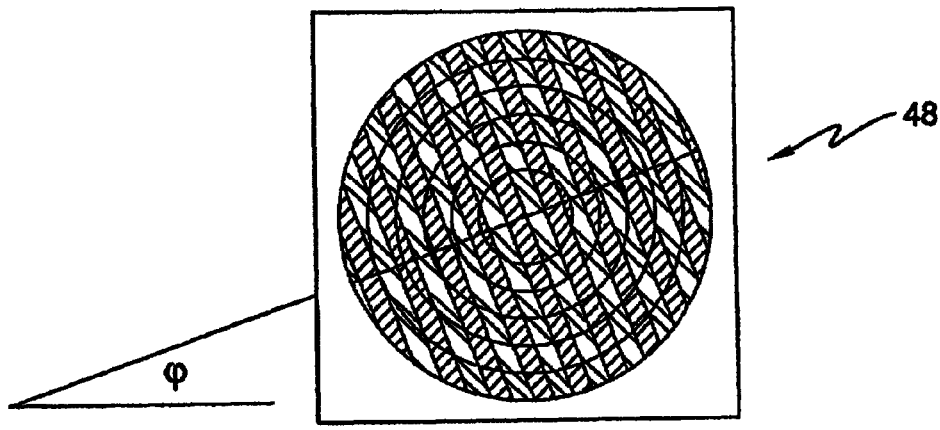
FIG. 11B shows the polarimeter set of FIG. 6A inclined at an angle φ.

The monitors of the polarimeter sets are described in more detail in FIGS. 11A and 11B. Referring to FIG. 11A, the radius of the inner ring within the nominal monitor is designated by $r_{in}$ and the radius of the monitor is designated by $r_{max}$. The width of each outer half ring in μm is designated by $w_{ring}$. P is the period of the four-phase linear phase progression in μm. $LPG_{angle}$ is the orientation of the fourth phase progression in the degrees 270-180-90-0 (with the phase etch progression always pointing to the center of the cluster), as shown in FIG. 11B.

Each monitor in the polarimeter is specified by:
$NA_m$ (designed for which numerical aperture, the mask dimensions of the radial part of the pattern scale as 1/NA)
$N_r$ (number rings in the analyzer. More rings produce more spillover fields into the center of the image and thus more sensitivity to polarization. However, more rings also mean greater sensitivity to placement of the backside pinhole.)
$\sigma_r$ (targeted radius in the illumination pupil-fill for the polarization measurement of a particular polarimeter)
ϕ (angle of 4-phase grating, which corresponds to the position of the polarimeter relative to the center of the cluster and, likewise, to the angle in the pupil-fill of the coordinate being measured)
EMFB (Electromagnetic bias, described below)
Pattern type (TE, TM, 45° or 135° in one embodiment; X, Y, 45°, 135° in another embodiment)

Monitor dimensions (at mask), as specified in FIG. 11A, are as follows:

$$F = \frac{M\lambda}{NA_m} = \frac{4 \times 193 \text{ nm}}{NA_m} \text{(scaling due to } NA\text{)}$$

$$r_{in} = .85F$$

$$r_{max} = (N_r + 0.35)F$$

$$w_{ring} = 0.5F$$

$$P = \frac{F}{\sigma_r}$$

ϕ ranges from 0° to 360°

Figure 1:
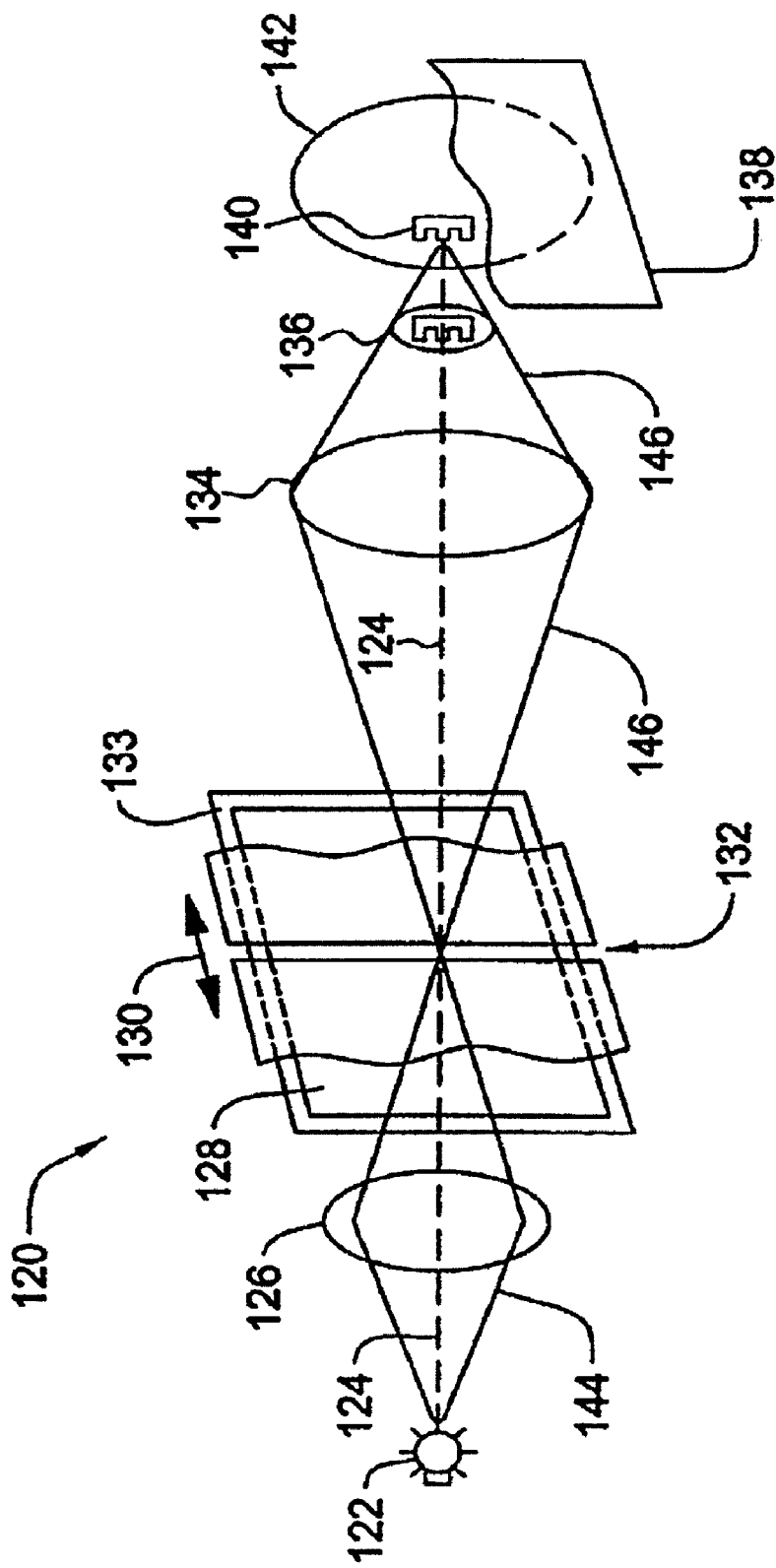
FIG. 1 shows a simplified diagram of a typical step and scan imaging tool used in the prior art.
Figure 2:
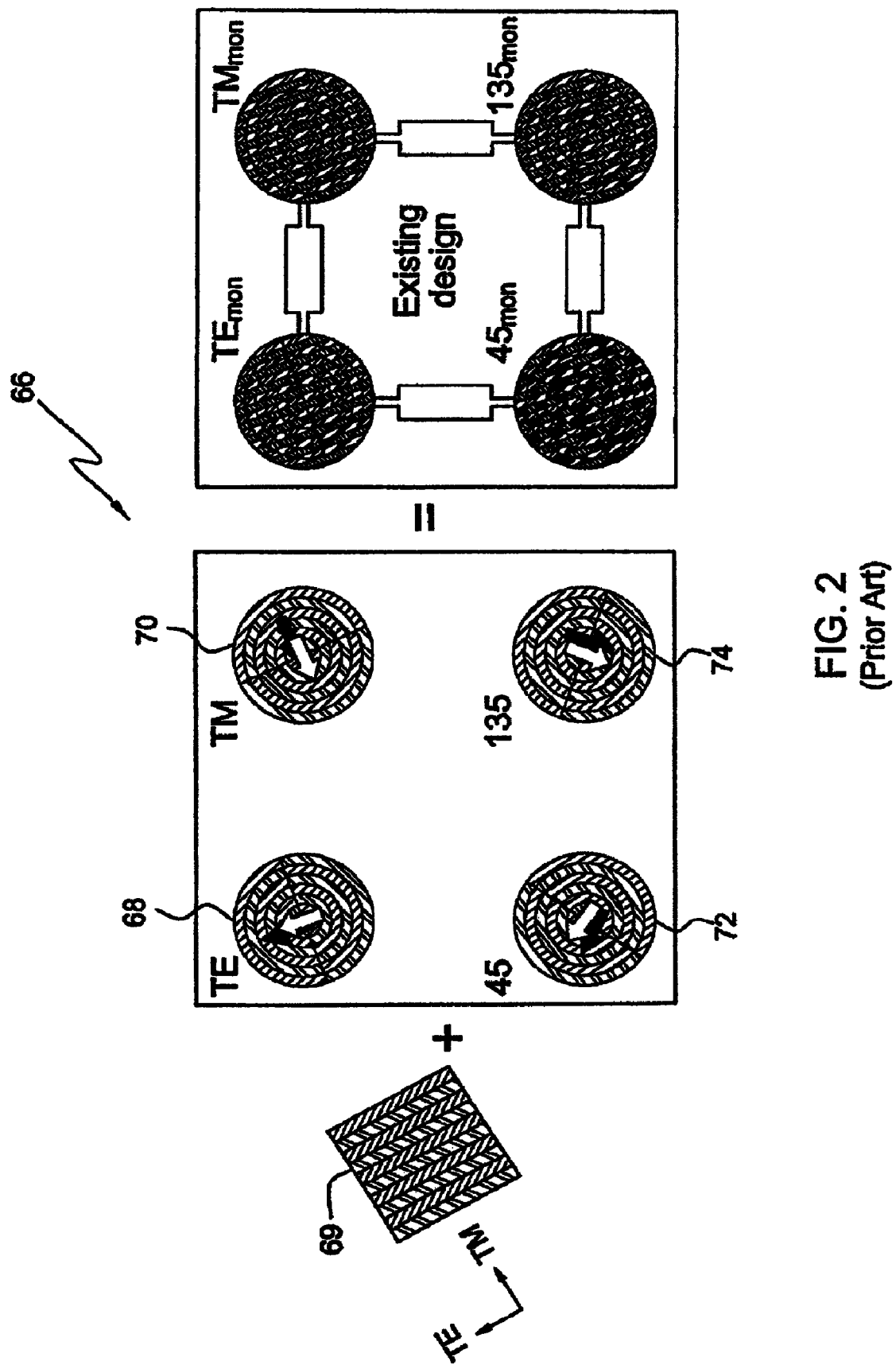
FIG. 2 shows a polarimeter set of the prior art.

FIG. 9B shows the difference between the X/Y monitors (of the invention) and the TE/TM monitors of the prior art shown in FIG. 2. FIGS. 9A, 9B, 10A, and 10B do not differentiate X/Y from TE/TM (they are shown at 0° in the cluster, where X/Y and TE/TM are identical). The design of the invention has both X/Y and TE/TM monitors. Depending on the experimenter's preference and what exactly is to be looked for, the experimenter may use either one. X/Y requires less measurements but TE/TM might provide more flexibility. The difference between the prior art monitor (FIG. 2) and the monitor of FIG. 9B is important because typically lithography is only dependent on the X and Y polarization characteristics of the illumination polarization. This is because the vast majority of patterns to be printed are oriented in the horizontal or vertical directions on the wafer, corresponding to the X and Y directions described here. Having monitors that provide a signal dependent on X or Y polarization may reduce the number of measurements needed by 50%. For example, if the amount of light in the X polarization component is desired, two measurements would be required using the TE/TM monitors (a ratio of the TE and TM monitors, where the ratio depends on the angle ϕ). However, only one measurement is needed with the X and Y monitors (the X for the x-component, and the Y for the y-component). Typically only one component is absolutely necessary. This gives the experimenter a means to reduce measurement time and still get a reasonably accurate measurement. Should a more precise measurement be needed, both X and Y monitors can be used. Both TE/TM and X/Y monitors may be used in the test reticle design for maximum experimental flexibility.

To enable greater resolution, i.e., more measurements per pupil-fill, spaced every 0.0033 pupil coordinates), only the TE, TM, 45° and 135° monitors or the X, Y, 45° and 135° monitors are used in the nominal design. The right and left circulars monitors, linear phase range and linear phase grating patterns used in the prior art are preferably not included in the polarization design of the present invention. This will be sufficient to monitor the S1/S0 and S2/S0 Stokes parameters.

The reticle of the invention may also accommodate a number of rows having specialty clusters where various parameters may be varied for experimental purposes. These include patterns for circular polarization. In a preferred embodiment the bottom three rows of the reticle may be used for the specialty clusters.

Figure 12:
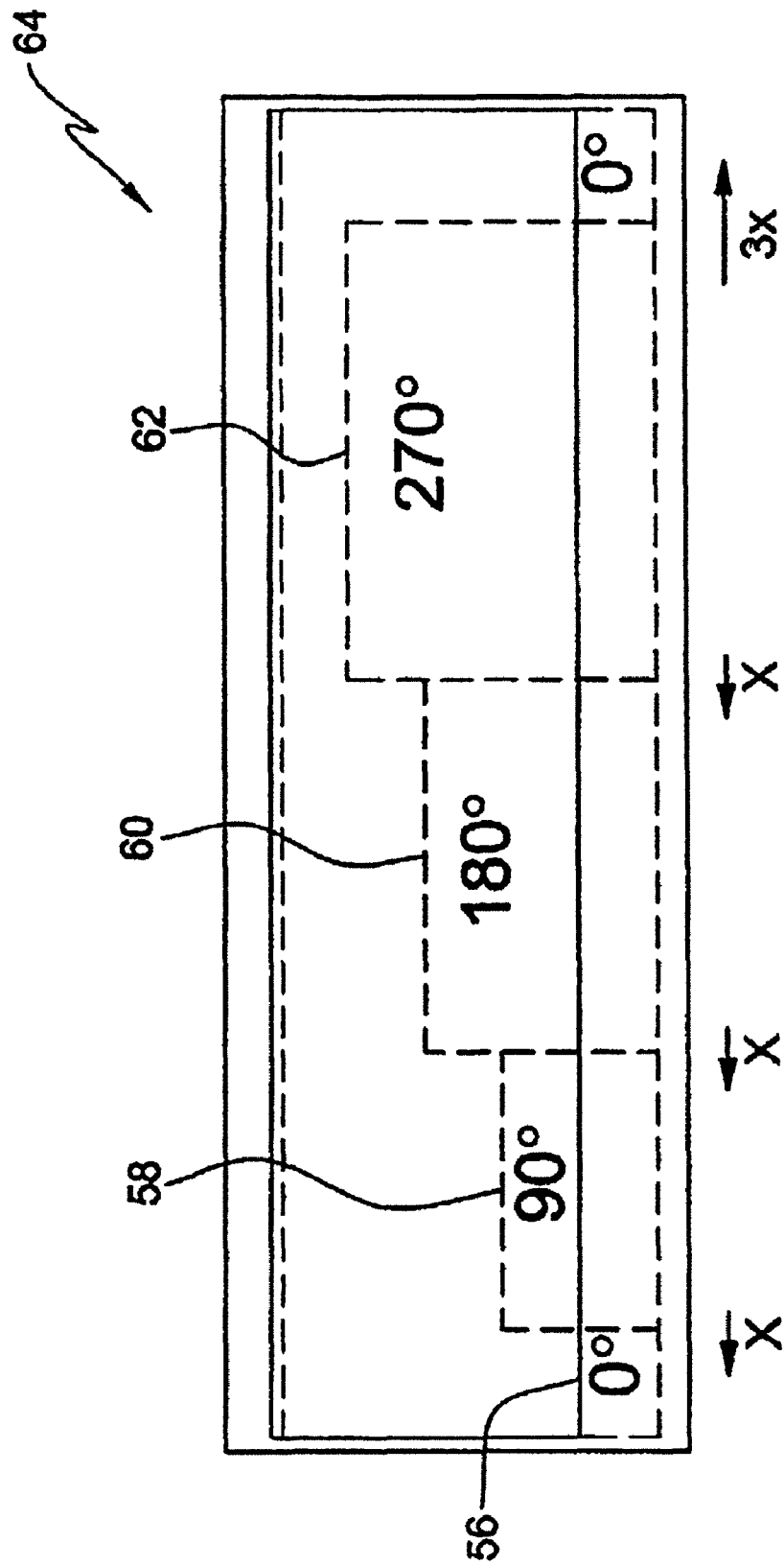
FIG. 12 shows the biased mask features to account for electromagnetic interaction of light with the vertical side walls of the etched regions of the transparent substrate.

EMFB refers to the need to bias mask features to account for electromagnetic interaction of light with vertical side walls of the etched regions in the quartz substrate that create the different phase shifts. This effect is primarily related to the vertical depth of the etch. In the design of the electromagnetic bias in the present invention, each etch region boundary is moved a biasing distance depending on the etch depth of that edge. The distance of boundary movement, X, for the bias is determined through simulation of the passage of the light through the phase shifting mask so that the image created has the desired sized phase-shifted regions as projected on the resist. The linear progression is shown in FIG. 12. When the step is 90°, the boundary between 0° and 90° regions 58 is moved toward the smaller etch depth (0°) by distance X. Likewise, the boundaries between the 90° and 180° regions 60 and between 180° and 270° regions 62 are of equal incremental height because of the 90° step between each, and are consequently each moved toward the smaller etch depth, 90° and 180° respectively, by distance X. On the other hand, the boundary between the 270° and 0° regions 56 has a step of 270° and is approximately three times the height of the 90° step boundaries 58, 60, 62, so the boundary there is moved towards the 0° region (in the opposite direction) by 3×. The result is that the higher phase etched regions have greater width than the lower, unetched 0° phase region. The result is that the light passing through the mask, which tends to propagate more through the low phase regions because of the etched vertical side walls, is projected in equal widths on the resist, despite the unequal widths of the etched phase regions on the mask. Only the 4-phase linear phase progression needs to be biased as described herein. The radial dimensions of the monitor rings do not receive a bias since polarization signal is minimal from ring boundaries and the additional edges may even degrade imaging.

The EMFB is applied to the linear phase grating portion the nominal layout design described above and in FIG. 11A and 11B. The mask is then written with these biased dimensions, where for example, the 0° regions are smaller than the 270° regions. When used in a scanner, as the light interacts with the vertical sidewalls of the border between etched regions, the net effect of the bias is for the subsequent imaging to behave more similar to an ideal thin-mask complex function. The optimum EMFB depends on NA and on the pupil-fill coordinate intended to be measured. The optimum bias distance can be determined using rigorous electromagnetic modeling (typically a finite difference time domain simulation) or via experiment. To simplify the design and layout process, typically a global optimal bias will be chosen and applied to all phase shifting regions. In addition to optimizing the EMF bias X value by simulation, typically an optimum phase depth for each region is determined via simulation. As with the X value, the optimum depth varies depending on feature size. Since photomasks are typically written and etched with 2 or 3 etch steps, a global optimum is typically formed as a best compromise among all features within the monitors of interest.

Figure 13A:
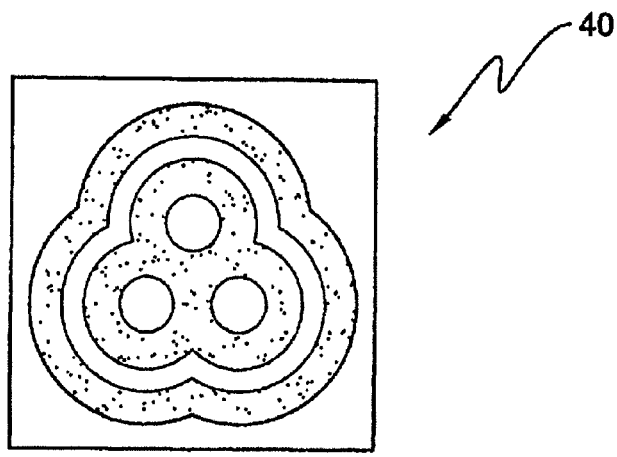
FIG. 13A shows the low-dose SEM alignment mark, consisting of a 0 and 180 degree phase region.
Figure 13B:
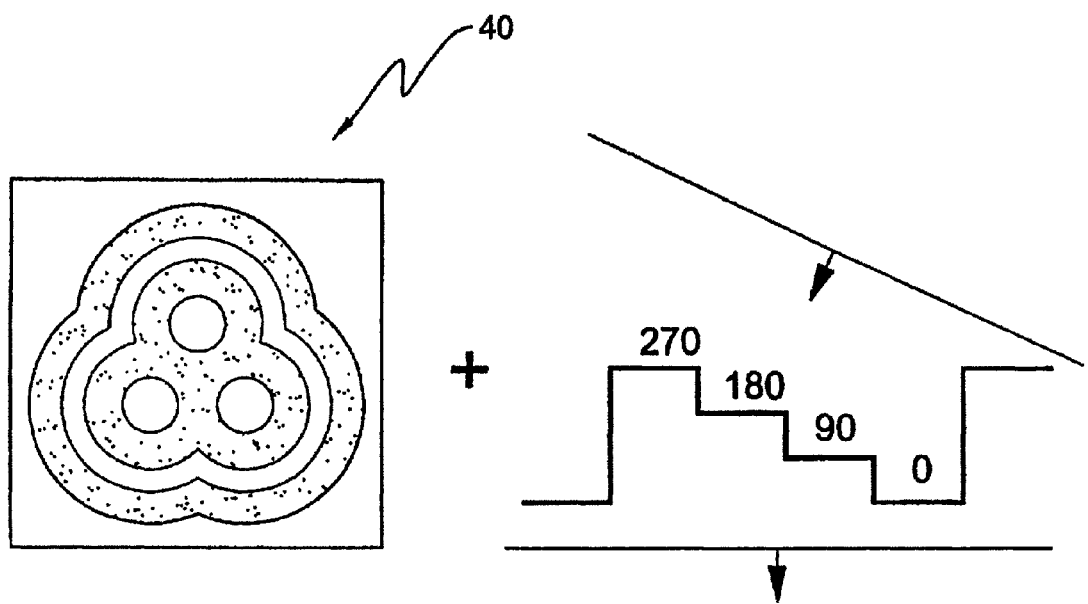
FIG. 13B shows how the low-dose SEM alignment of FIG. 13A is modified for a particular illumination angle with the superposition of a 4-phase linear phase grating.

Referring now to FIGS. 13A and 13B, the tri-PSF low-dose SEM alignment mark is shown as numeral 40. The purpose of this alignment mark is to ensure that an alignment mark feature recognizable by an SEM prints at low dose values. This is important if the single reticle embodiment described in this invention is used since a typical polarization monitoring wafer is exposed with a very large range of dose values. Below a certain dose threshold, the patterns of interest may print but the alignment marks may not. Thus, this low-dose alignment mark is used so an automated SEM can be used even at low dose values. The mask pattern is derived from the point spread function of the imaging tool, where the radius of the inner circle is equal to 0.6 F and is nominally 0° etch. The width of the outer rings is 0.5 F is nominally a 180° etch. The number of rings is chosen to correspond to the number of rings of polarization monitors in that cluster. As with the polarization monitors, the pattern is modified for a particular illumination angle with the same period of orientation provide an off-axis version. The image on the wafer will be three holes in photoresist that can be used as a pattern recognition target for alignment of the SEM.

The reticle of the present invention is able to monitor polarization at a greater number of locations across the scanning slit, preferably at 25 locations or more. This is to be compared with the prior art reticles which measured only six locations across the scanning slit.

The reticle of the invention may be used for NA values ranging from 0.85 to 1.35. Each row of the reticle of the invention has monitors with dimensions designed specifically for NA's of 0.9, 1.0, 1.1, 1.2, or 1.3. However, all NAs in this range are usable, i.e., 1.2 NA monitors are usable for NAs of 1.15 to 1.25. Proper calibration will be required. The reticle of the invention is provided with monitors which are designed to provide a larger polarization dependant signal and are thus more sensitive to polarization. The monitors are designed with a variety of different radii thus providing varying degrees of sensitivity and flexibility in misalignment of backside pinhole during manufacturing. Larger radius provides more signal, however it is more sensitive to pinhole misalignment. To accommodate the range of NA's each pinhole is sized accordingly such as to provide a core of light with an effective illumination pupil-fill radius of 0.1, commonly known as "sigma." The 0.1 sigma has been determined to be an optimal trade-off between pattern polarization sensitivity (smaller sigma enables more sensitivity) and scanner dose values required (more light is lost due to smaller pinholes).

While the present invention has been particularly described, in conjunction with a specific preferred embodiment, it is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

Thus, having described the invention, what is claimed is:

1. A polarization monitoring reticle for lithographic scanners comprising:
    a transparent planar substrate having a front side and a back side, both the back side and front side having an opaque layer thereon; and
    an X-Y row and column array of pin hole-cluster combinations on the substrate;
    wherein each cluster comprising an X-Y array of a plurality of polarimeter sets in the opaque layer on the front side of the substrate, with each cluster located adjacent a corresponding pin hole in the opaque layer on the back side of the substrate;

each set of polarimeters comprising an X-Y array of a plurality of polargraphic monitors within each set, each monitor within each polarimeter set being a defined distance from the center of the polarimeter set and each set of polarimeters having indicia identifying the cluster row, cluster column, X position of the center of the polarimeter set relative to the cluster center and Y position of the center of the polarimeter set relative to the cluster center; and the monitors creating at an image plane a measurable output signal dependent on polarization of illumination when illumination from a light source is passed through the reticle.

2. The reticle of claim 1 wherein one or more of the sets of polarimeters includes an X or Y polarization monitor that creates at an image plane a measurable output signal dependent on X or Y polarization of illumination when illumination from a light source is passed through the reticle.

3. The reticle of claim 1 wherein the reticle includes one or more SEM alignment marks in one or more of the sets of polarimeters.

4. The reticle of claim 1 wherein the reticle includes a low dose alignment mark in one or more of the sets of polarimeters, the low dose alignment mark comprising a pattern recognizable by an SEM at low exposure doses of the illumination.

5. The reticle of claim 1 wherein the reticle includes a low dose alignment mark in one or more of the sets of polarimeters, the low dose alignment mark comprising a pattern recognizable by an SEM at low exposure doses of the illumination for both on- and off-axis rays of the illumination.

6. The reticle of claim 1 wherein the reticle includes a clear field in one or more of the sets of polarimeters to measure total intensity of the illumination therethrough.

7. The reticle of claim 1 wherein the monitors in the sets of polarimeters have different radii to provide varying degrees of sensitivity to the polarization of the illumination passing therethrough.

8. The reticle of claim 1 wherein the size of the pinholes on the back side layer vary depending on the numerical aperture that the corresponding cluster is designed to monitor.

9. A method of monitoring polarization during lithographic scanning comprising:

providing a lithographic scanning system having a light source and a numerical aperture of at least 0.85;

providing a reticle comprising a transparent planar substrate having a front side and a back side, both the front side and the back side having an opaque layer thereon and an X-Y row and column array of pin hole-cluster combinations on the substrate, each cluster comprising an X-Y array of a plurality of polarimeter sets in the opaque layer on the front side of the substrate, with each cluster located adjacent a corresponding pin hole in the opaque layer on the back side of the substrate, each set of polarimeters comprising an X-Y array of a plurality of polargraphic monitors within each set, each monitor within each polarimeter set being a defined distance from the center of the polarimeter set and each set of polarimeters having indicia identifying the cluster row, cluster column, X position of the center of the polarimeter set relative to the cluster center and Y position of the center of the polarimeter set relative to the cluster center;

passing illumination from the light source through the reticle and exposing a photoresist layer, whereby the monitors creating a measurable output signal dependent on polarization of illumination; and measuring the resulting images in the photoresist layer to determine the degree of polarization of the illumination passed through the reticle.

10. The method of claim 9 wherein the set of polarimeters includes an X or Y polarization monitor and measures at the photoresist layer the degree of X or Y polarization of the illumination passed through the reticle.

11. The method of claim 9 wherein one or more of the sets of polarimeters includes an X or Y polarization monitor that creates at an image plane a measurable output signal dependent on X or Y polarization of illumination when illumination from a light source is passed through the reticle.

12. The method of claim 9 wherein the reticle includes one or more SEM alignment marks in one or more of the sets of polarimeters.

13. The method of claim 9 wherein the reticle includes a low dose alignment mark in one or more of the sets of polarimeters, the low dose alignment mark comprising a pattern recognizable by an SEM at low exposure doses of the illumination.

14. The method of claim 9 wherein the reticle includes a low dose alignment mark in one or more of the sets of polarimeters, the low dose alignment mark comprising a pattern recognizable by an SEM at low exposure doses of the illumination for both on- and off-axis rays of the illumination.

15. The method of claim 9 wherein the reticle includes a clear field in one or more of the sets of polarimeters to measure total intensity of the illumination therethrough.

16. The method of claim 9 wherein the monitors in the sets of polarimeters have different radii to provide varying degrees of sensitivity to the polarization of the illumination passing therethrough.

17. The method of claim 9 wherein the size of the pinholes on the back side layer vary depending on the numerical aperture that the corresponding cluster is designed to monitor.

18. A polarization monitoring reticle set for lithographic scanners comprising:

a first reticle comprising:
a first transparent planar substrate having a front side and a back side, both the back side and front side having an opaque layer thereon;
an X-Y row and column array of pin hole-cluster combinations on the first substrate;
each cluster on the first substrate comprising an X-Y array of a plurality of polarimeter sets in the opaque layer on the front side of the first substrate, with each cluster located adjacent a corresponding pin hole in the opaque layer on the back side of the first substrate;
each set of polarimeters on the first substrate comprising an X-Y array of a plurality of polargraphic monitors within each set, each monitor within each polarimeter set being a defined distance from the center of the polarimeter set,
the monitors on the first substrate creating at an image plane a measurable output signal dependent on polarization of illumination when illumination from a light source is passed through the reticle; and a second reticle comprising:
a second transparent planar substrate having a front side and a back side, the front side having an opaque layer thereon;
an X-Y row and column array of clusters on the second substrate corresponding to the pin hole-cluster combinations on the first substrate;

each cluster on the second substrate comprising an X-Y array of location indicia on the front side of the second substrate, with each cluster located adjacent a corresponding set of polarimeters on the first substrate and comprising indicia identifying the cluster row, cluster column, X position of the center of the polarimeter set relative to the cluster center and Y position of the center of the polarimeter set relative to the cluster center.

19. The reticle of claim 18 wherein one or more of the sets of polarimeters includes an X or Y polarization monitor that creates at an image plane a measurable output signal dependent on X or Y polarization of illumination when illumination from a light source is passed through the reticle.

20. The reticle of claim 18 wherein the first and second reticles include one or more SEM alignment marks in one or more of the sets of polarimeters.

21. The reticle of claim 18 wherein the first reticle includes a low dose alignment mark in one or more of the sets of polarimeters, the low dose alignment mark comprising a pattern recognizable by an SEM at low exposure doses of the illumination.

22. The reticle of claim 18 wherein the first reticle includes a low dose alignment mark in one or more of the sets of polarimeters, the low dose alignment mark comprising a pattern recognizable by an SEM at low exposure doses of the illumination for both on- and off-axis rays of the illumination.

23. The reticle of claim 18 wherein the first reticle includes a clear field in one or more of the sets of polarimeters to measure total intensity of the illumination therethrough.

24. The reticle of claim 18 wherein the monitors in the sets of polarimeters have different radii to provide varying degrees of sensitivity to the polarization of the illumination passing therethrough.

25. The reticle of claim 18 wherein the size of the pinholes on the back side layer vary depending on the numerical aperture that the corresponding cluster is designed to monitor.

26. A method of monitoring polarization during lithographic scanning comprising:
   providing a lithographic scanning system having a light source and a numerical aperture of at least 0.85;
   providing a first reticle comprising a first transparent planar substrate having a front side and a back side, both sides having an opaque layer thereon and an X-Y row and column array of pin hole-cluster combinations on the first substrate, each cluster on the first substrate comprising an X-Y array of a plurality of polarimeter sets on the front side of the first substrate, with each cluster located adjacent a corresponding pin hole in the opaque layer on the back side of the first substrate, each set of polarimeters on the first substrate comprising an X-Y array of a plurality of polargraphic monitors within each set, each monitor within each polarimeter set being a defined distance from the center of the polarimeter set;
   passing illumination from the light source through the first reticle and exposing a photoresist layer, whereby the monitors creating a measurable output signal dependent on polarization of illumination;
   repeating the exposure of the photoresist layer at different locations with a different dose of the illumination at each location;
   providing a second reticle comprising a second transparent planar substrate having a front side and a back side, the front side having an opaque layer thereon and an X-Y row and column array of clusters on the second substrate corresponding to the pin hole-cluster combinations on the first substrate, each cluster on the second substrate comprising an X-Y array of location indicia on the front side of the second substrate, with each cluster located adjacent a corresponding set of polarimeters on the first substrate and comprising indicia identifying the cluster row, cluster column, X position of the center of the polarimeter set relative to the cluster center and Y position of the center of the polarimeter set relative to the cluster center;
   passing illumination from the light source through the second reticle and exposing the photoresist layer at the same locations as with the first reticle and with the same dose of the illumination at each location;
   measuring on the photoresist degree of polarization of the illumination passed through the reticle.

27. The method of claim 26 wherein one or more of the sets of polarimeters includes an X or Y polarization monitor that creates at an image plane a measurable output signal dependent on X or Y polarization of illumination when illumination from a light source is passed through the reticle.

28. The method of claim 26 wherein the first and second reticles include one or more SEM alignment marks in one or more of the sets of polarimeters.

29. The method of claim 26 wherein the first reticle includes a low dose alignment mark in one or more of the sets of polarimeters, the low dose alignment mark comprising a pattern recognizable by an SEM at low exposure doses of the illumination.

30. The method of claim 26 wherein the first reticle includes a low dose alignment mark in one or more of the sets of polarimeters, the low dose alignment mark comprising a pattern recognizable by an SEM at low exposure doses of the illumination for both on- and off-axis rays of the illumination.

31. The method of claim 26 wherein the first reticle includes a clear field in one or more of the sets of polarimeters to measure total intensity of the illumination therethrough.

32. The method of claim 26 wherein the monitors in the sets of polarimeters have different radii to provide varying degrees of sensitivity to the polarization of the illumination passing therethrough.

33. The method of claim 26 wherein the size of the pinholes on the back side layer vary depending on the numerical aperture that the corresponding cluster is designed to monitor.

* * * * *